(12) United States Patent
Bobisuthi

(10) Patent No.: US 6,549,630 B1
(45) Date of Patent: Apr. 15, 2003

(54) SIGNAL EXPANDER WITH DISCRIMINATION BETWEEN CLOSE AND DISTANT ACOUSTIC SOURCE

(75) Inventor: James F. Bobisuthi, Boulder Creek, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 09/499,090

(22) Filed: Feb. 4, 2000

(51) Int. Cl.[7] .......................... H04B 15/00; H04R 3/00; H03G 7/00

(52) U.S. Cl. .................. 381/94.7; 381/92; 381/106; 381/107

(58) Field of Search ............................. 381/106, 94.1, 381/94.7, 92, 107, 94.2; 367/118, 119, 124, 121

(56) References Cited

U.S. PATENT DOCUMENTS

| | | | |
|---|---|---|---|
| 3,057,960 A | * 10/1962 | Kaiser | 381/94.5 |
| 3,109,066 A | * 10/1963 | David, Jr. | 367/2 |
| 5,511,128 A | * 4/1996 | Lindemann | 381/356 |
| 5,586,191 A | * 12/1996 | Elko et al. | 381/92 |
| 5,978,490 A | * 11/1999 | Choi et al. | 381/107 |
| 6,005,953 A | * 12/1999 | Stuhlfelner | 381/107 |
| 6,272,229 B1 | * 8/2001 | Baekgaard | 381/312 |

\* cited by examiner

*Primary Examiner*—Forester W. Isen
*Assistant Examiner*—Brian Tyrone Pendleton
(74) *Attorney, Agent, or Firm*—Peter Hsieh

(57) ABSTRACT

An apparatus for discriminating between signals produced by a desired acoustic source and an undesired acoustic source includes: a first microphone disposed at a first distance from the desired acoustic source; at least a second microphone disposed at a second distance from the desired acoustic source; a proximity estimation block configured to utilize signals form the first microphone and second microphone to produce a signal representing an estimate of the proximity of the desired acoustic source; and a variable gain block configured to adjust the gain of an output signal from at least one of the microphones by utilizing the estimate of the proximity of the desired acoustic source. A method of discriminating between signals produced by a desired acoustic source and an undesired acoustic source includes: utilizing signals from a first microphone and second microphone to produce an output signal representing an estimate of the proximity of the desired acoustic source; and adjusting the gain of the signal from at least one of the first and second microphones by utilizing the estimate of the proximity of the desired acoustic source.

54 Claims, 14 Drawing Sheets

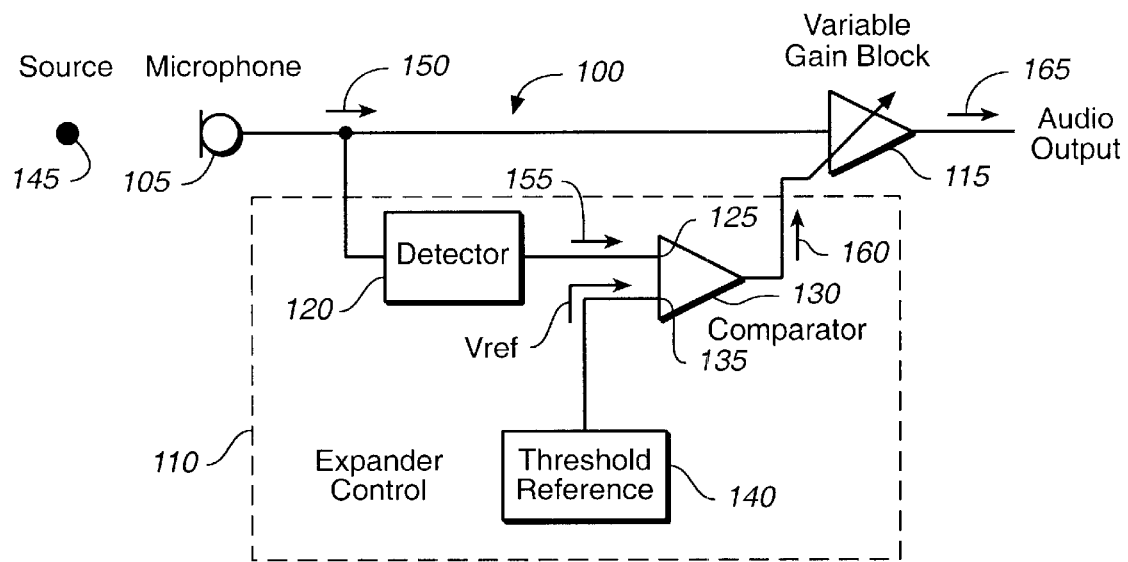
FIG._1A (PRIOR ART)
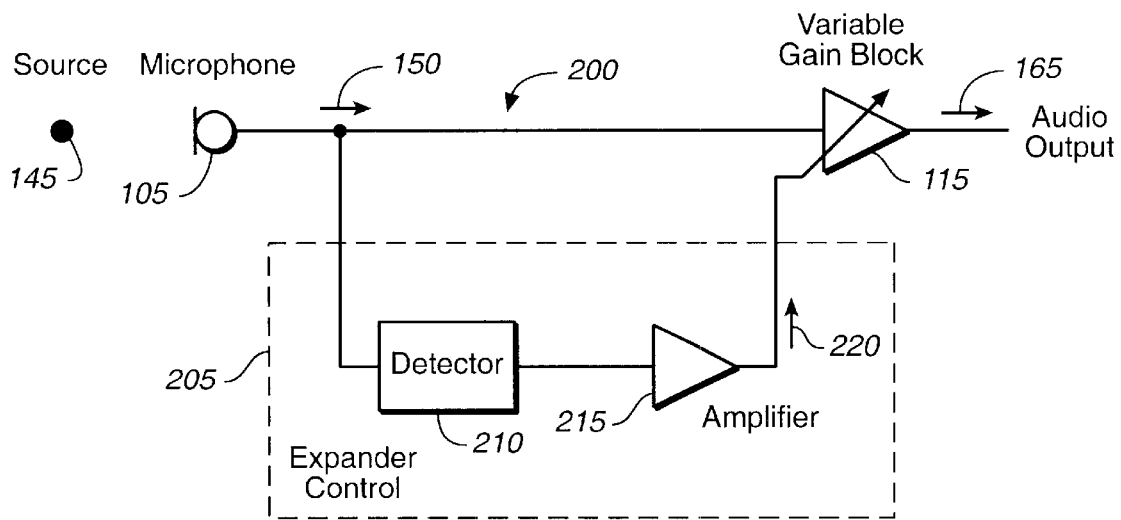
FIG._1B (PRIOR ART)

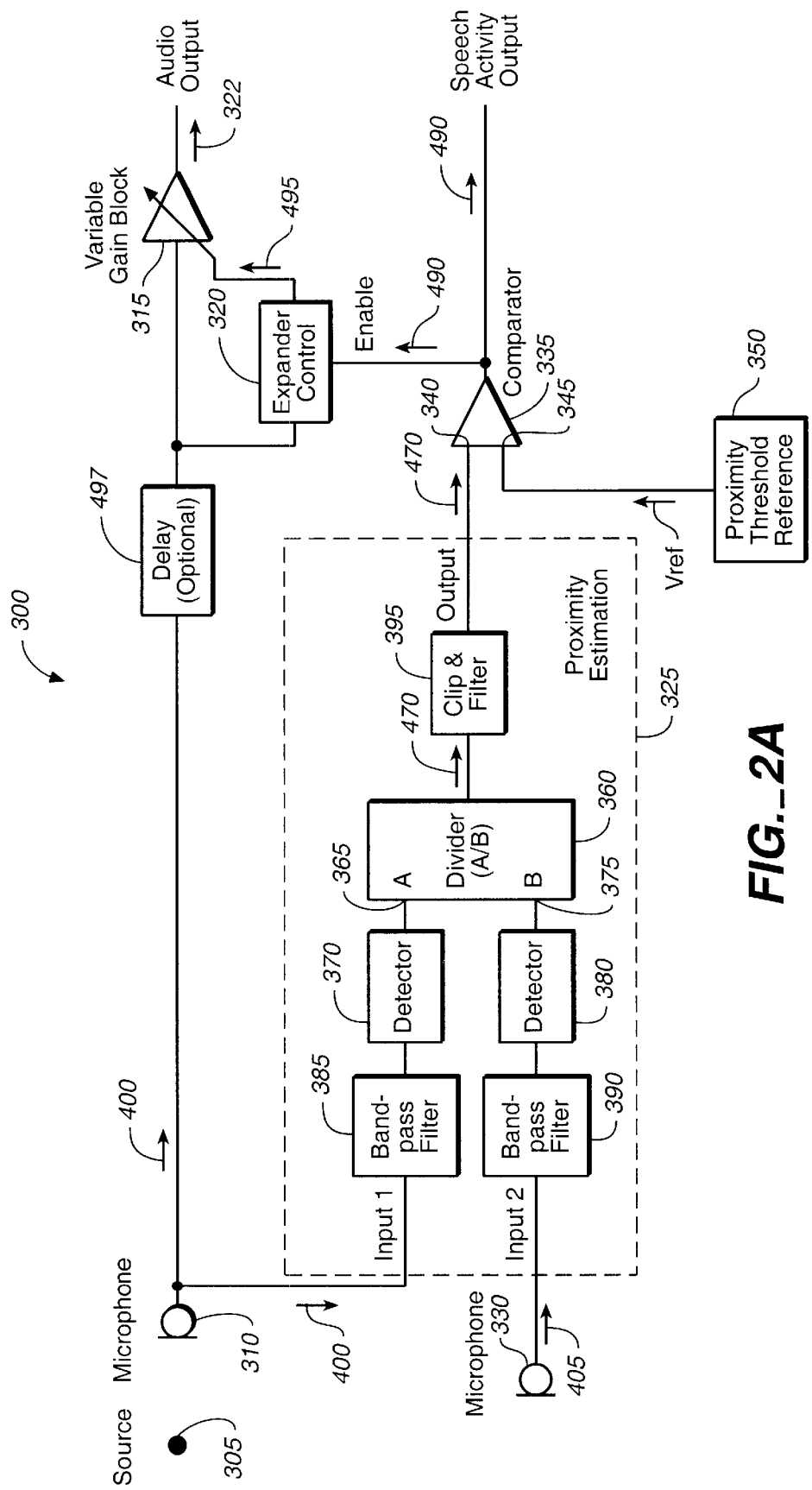
FIG._2A

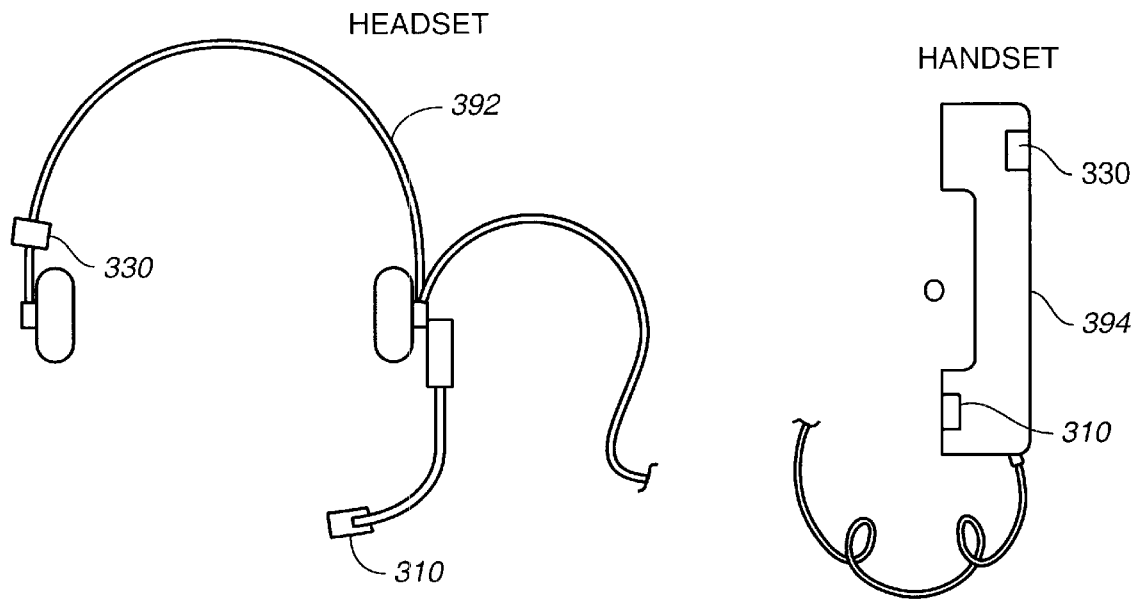
FIG._2B
FIG._2C
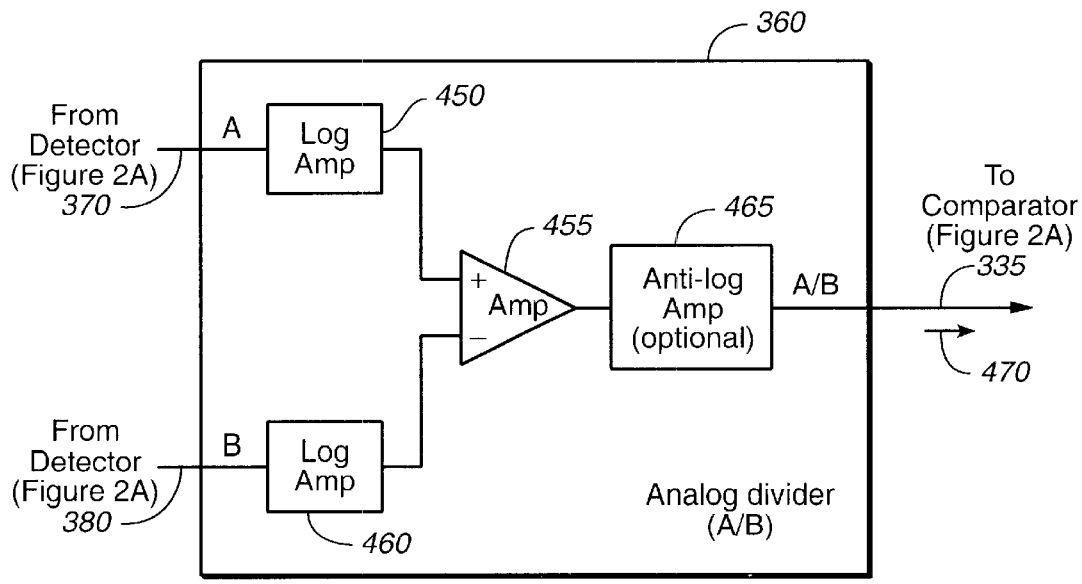
FIG._3

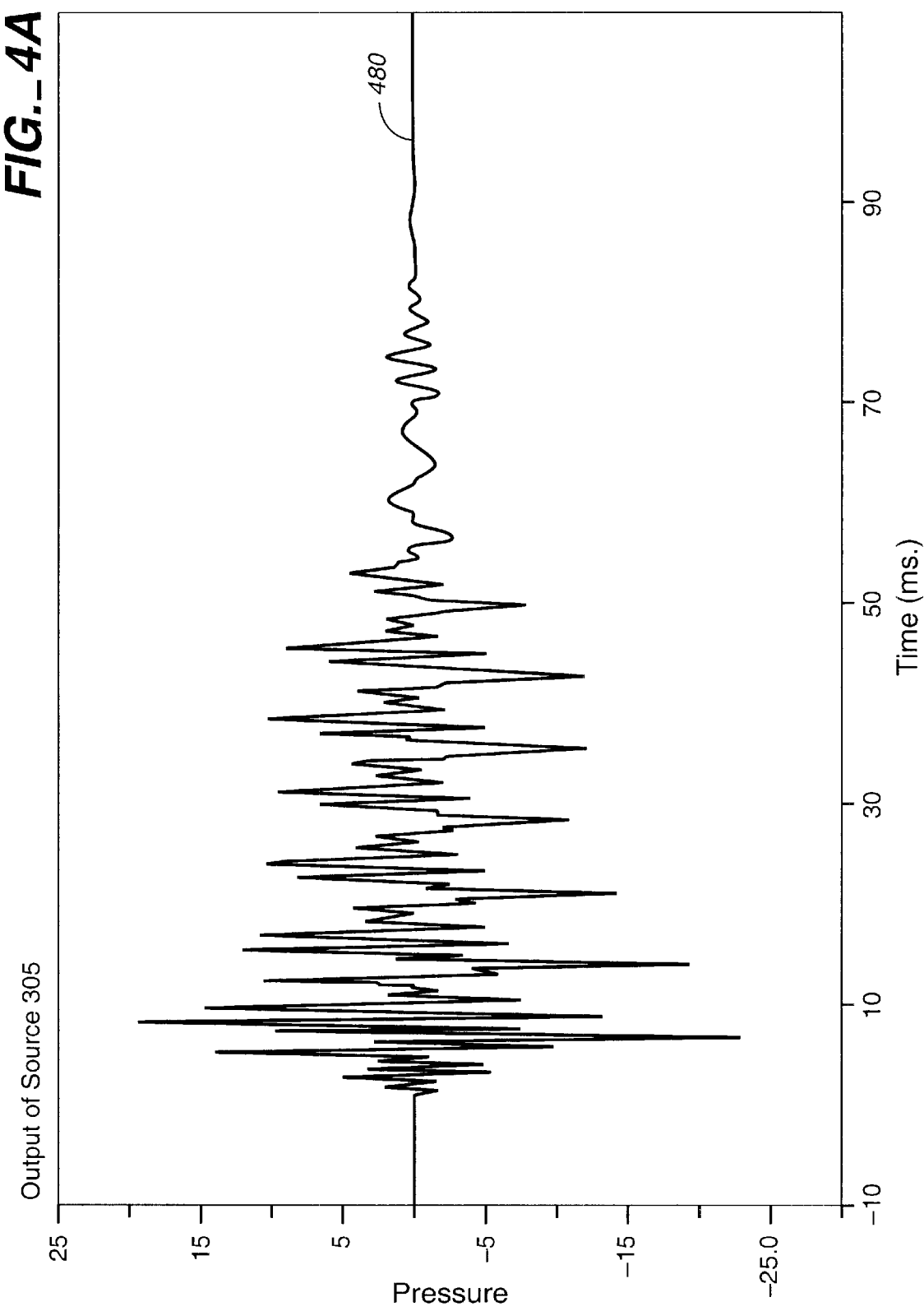

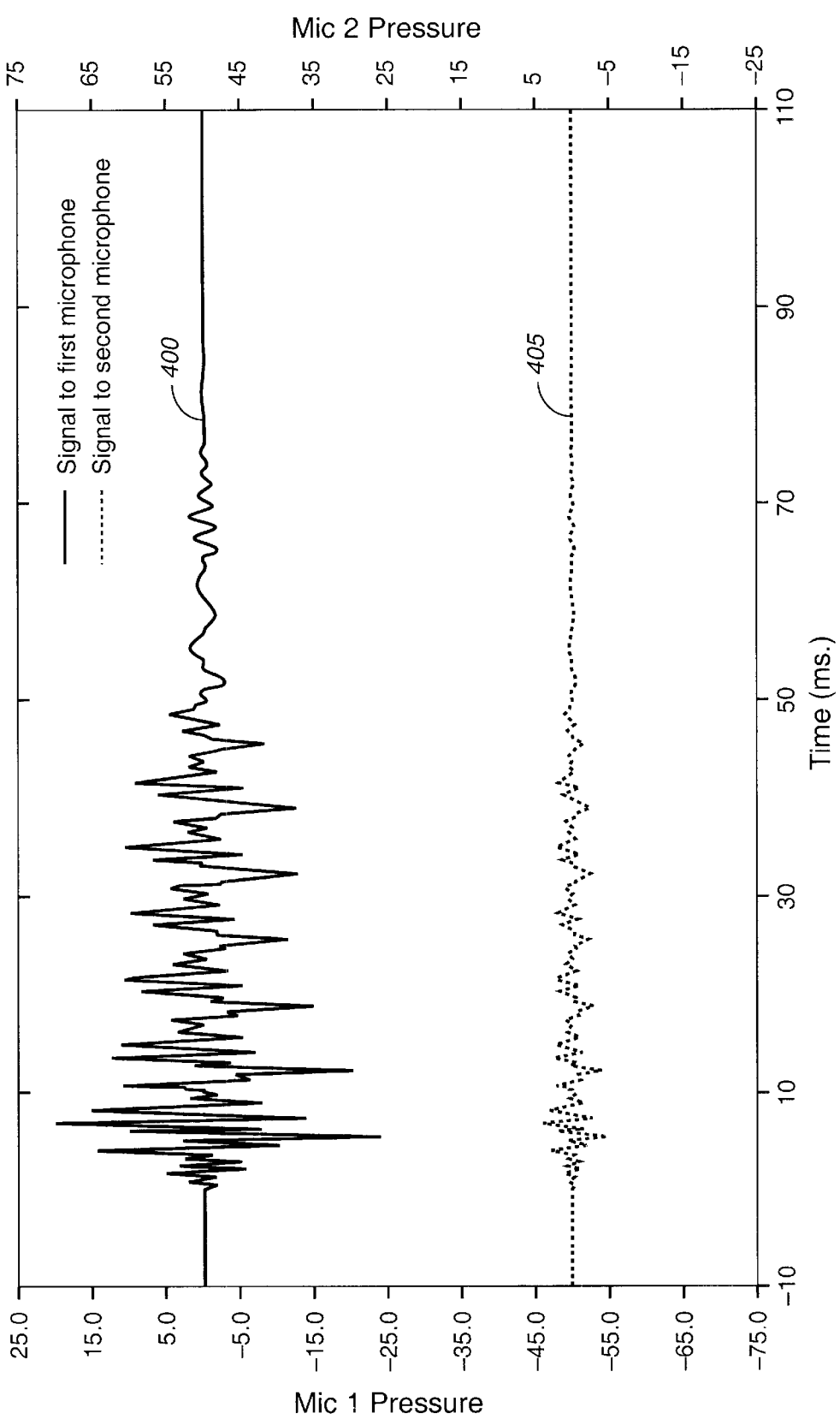

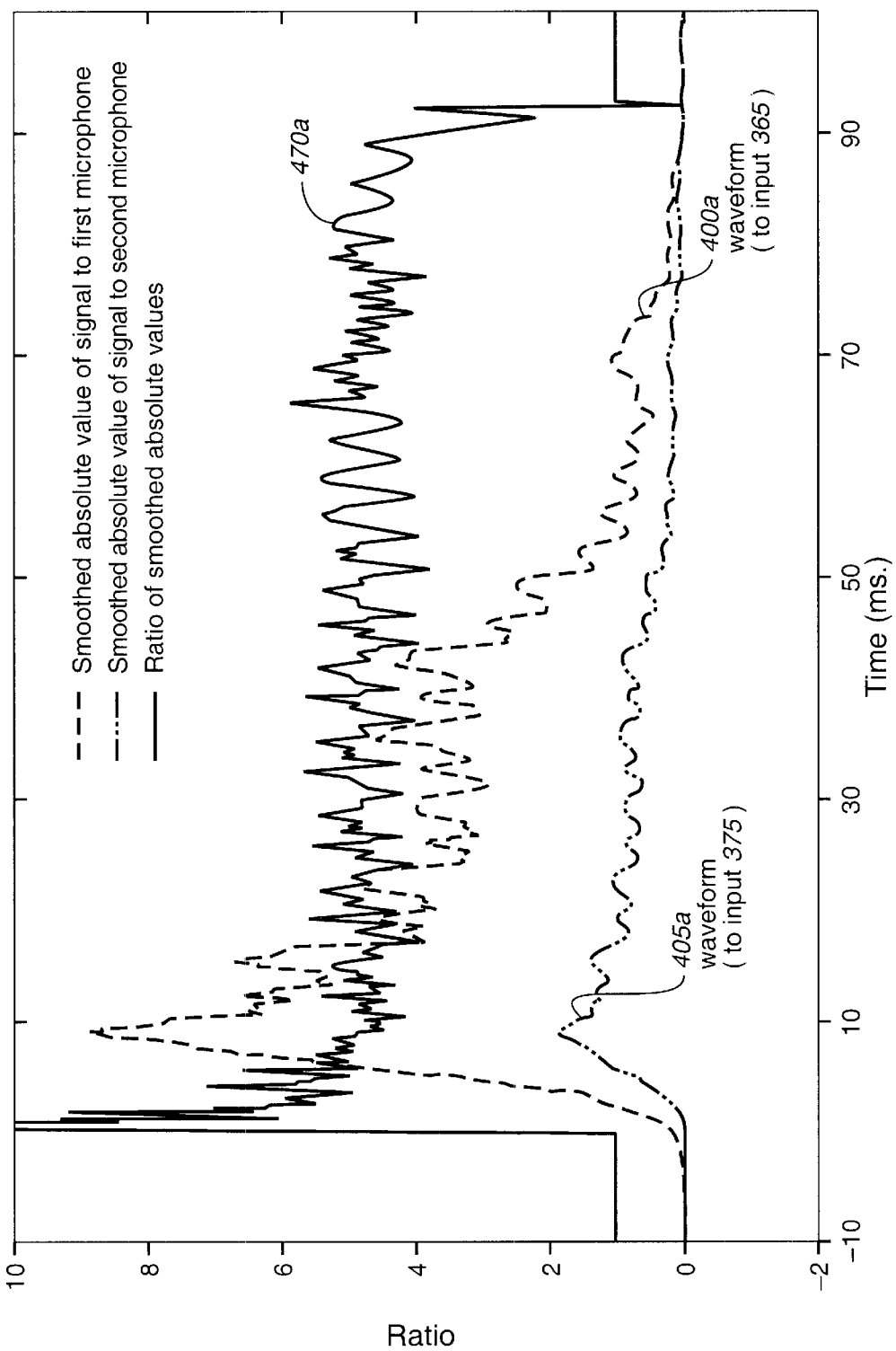

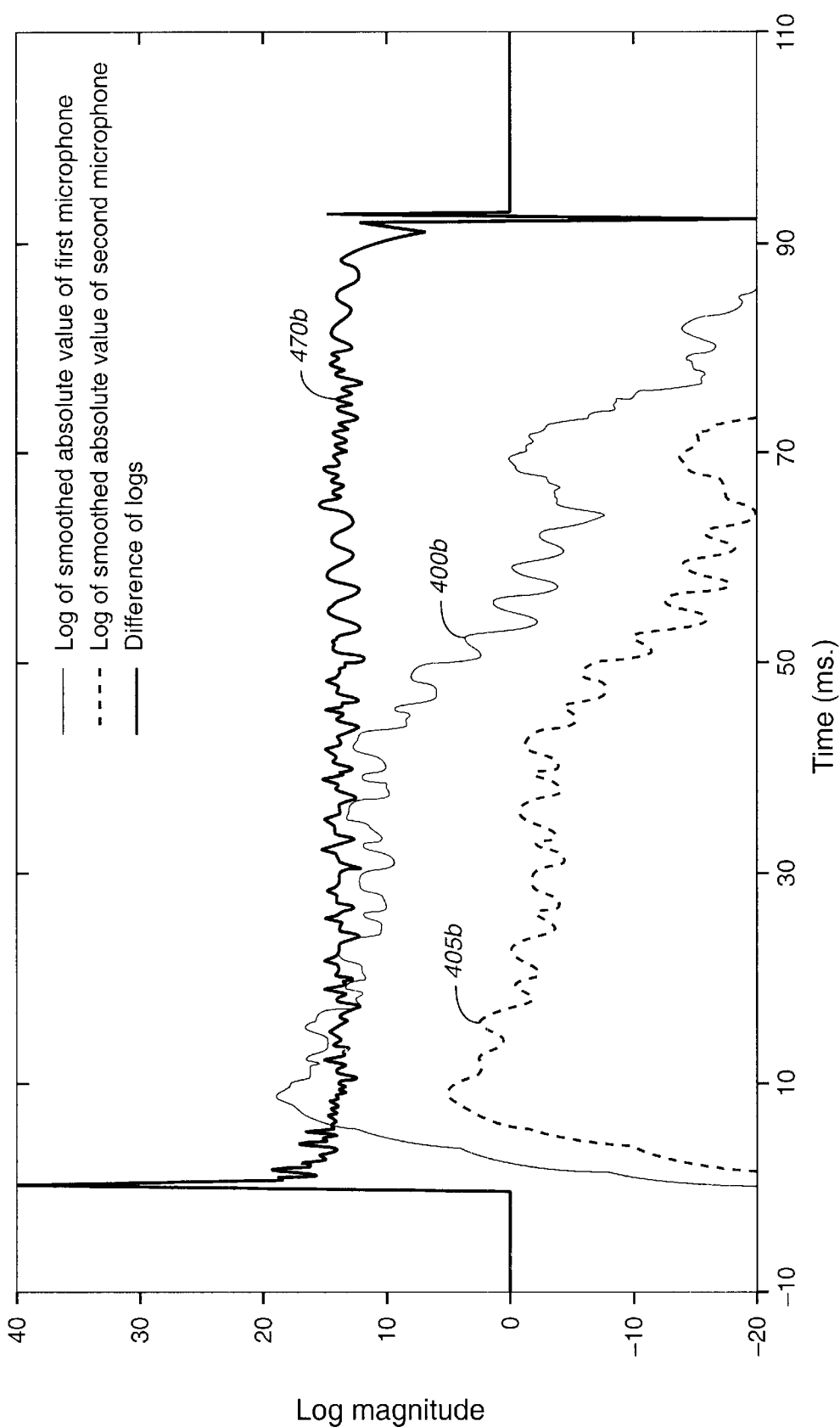

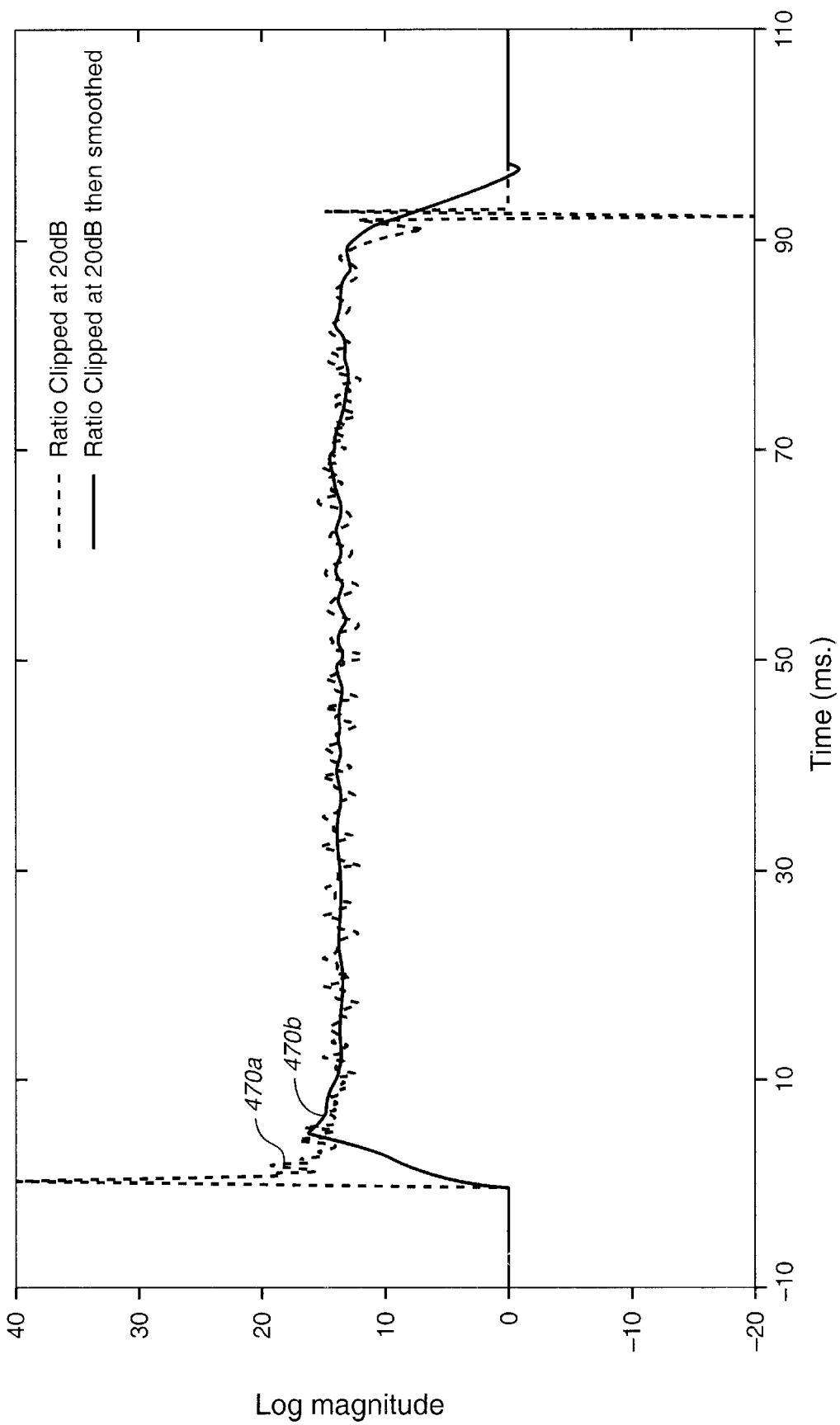

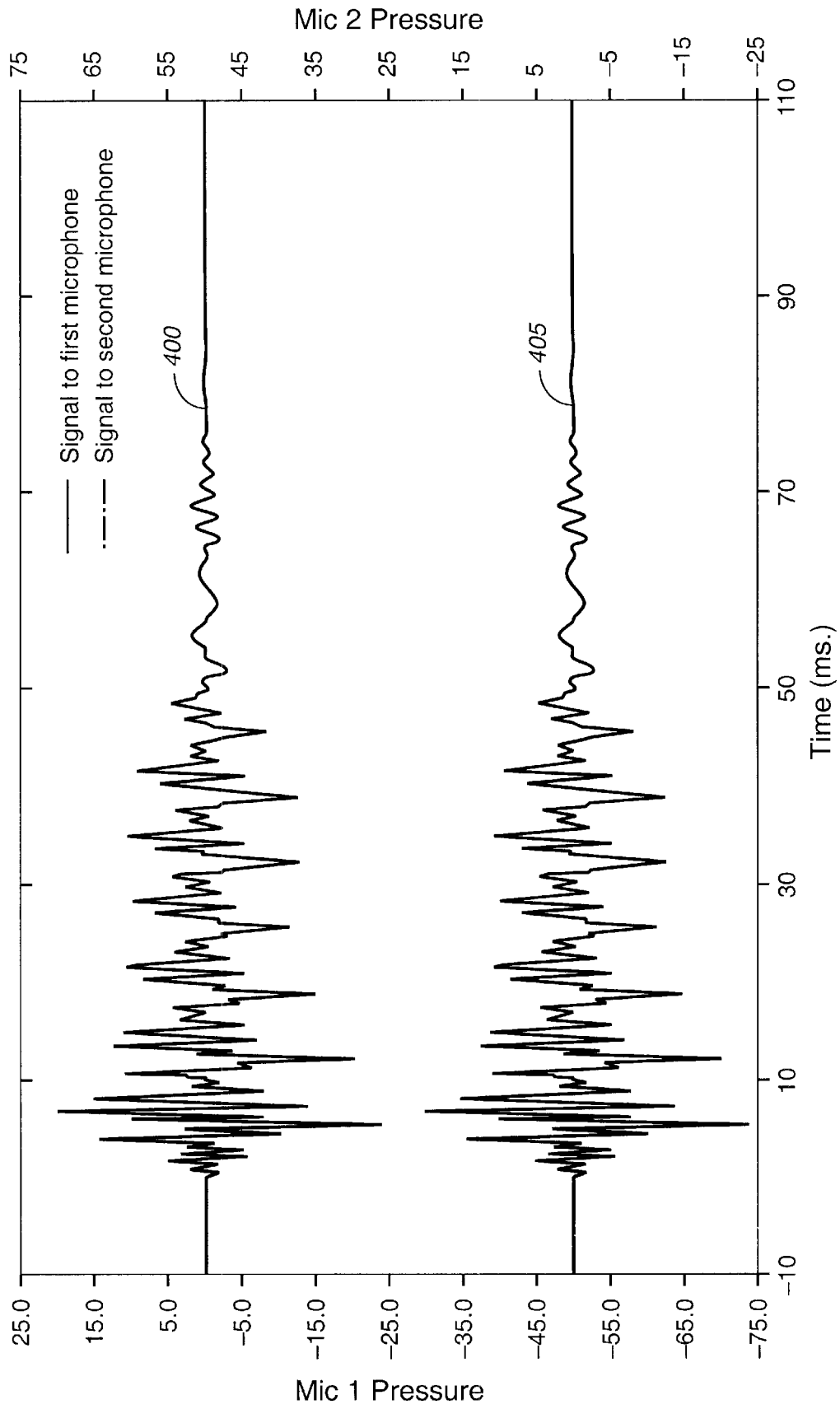
FIG._4F

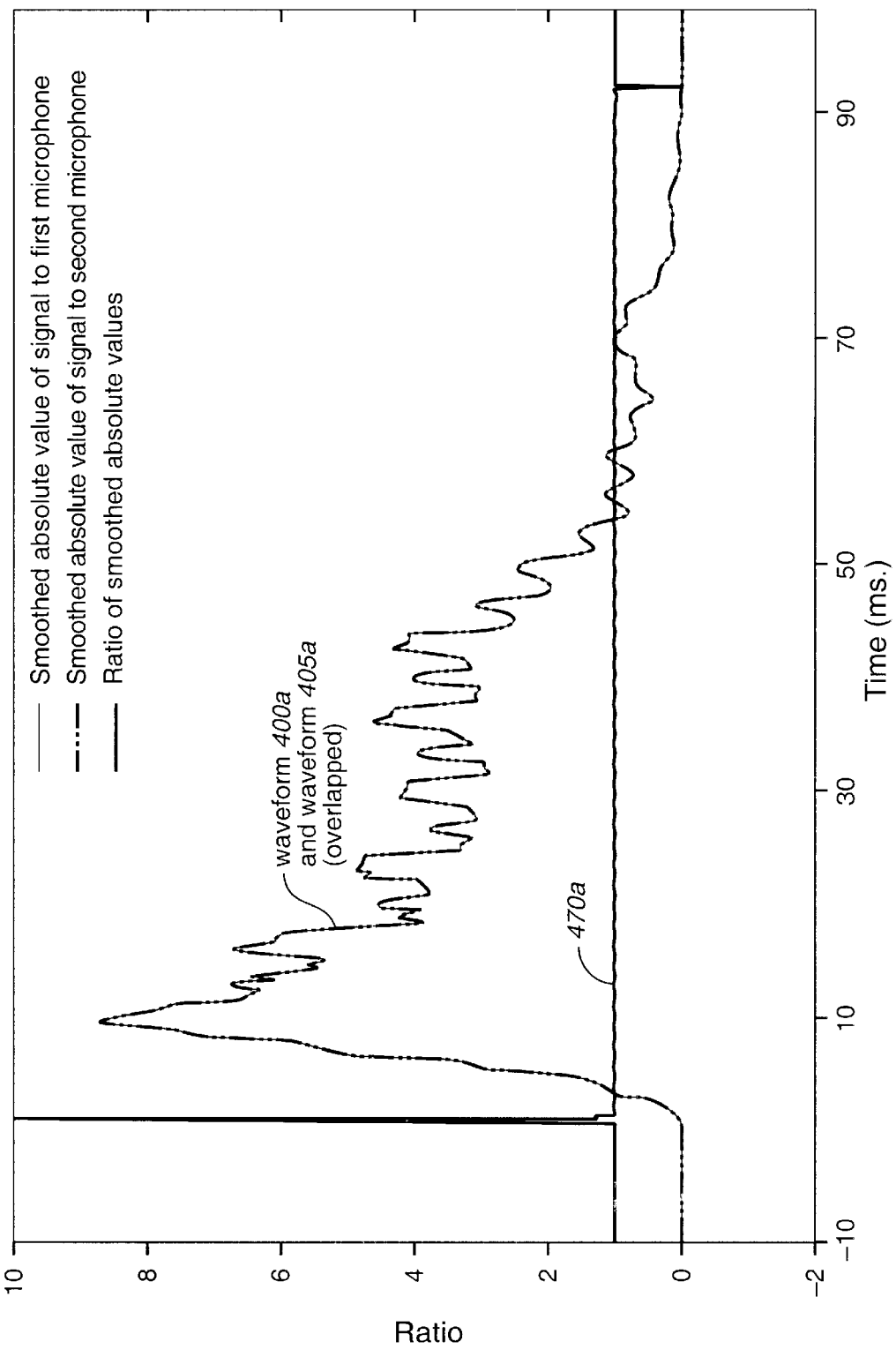
FIG._4G

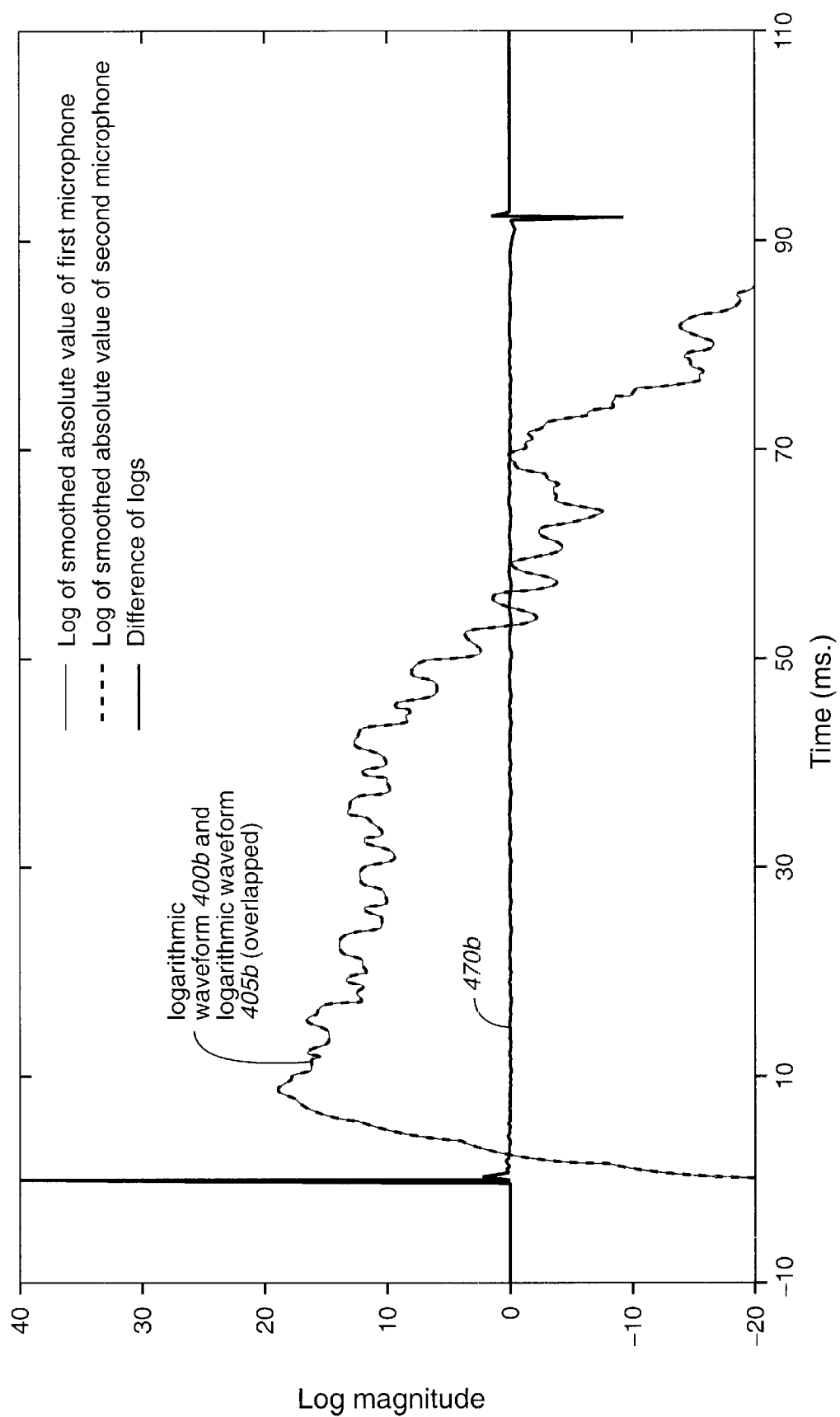
FIG._4H

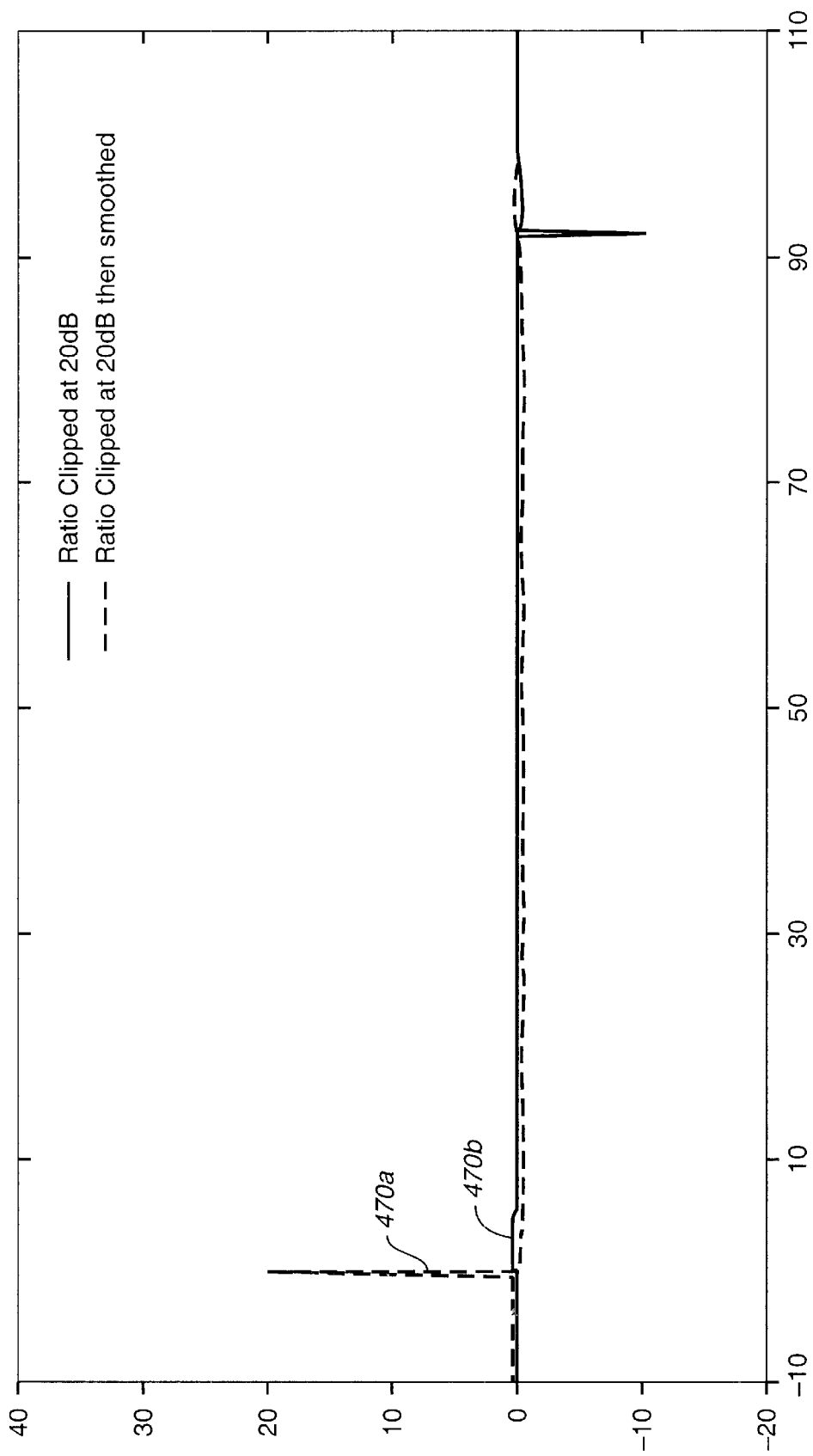
FIG._4I

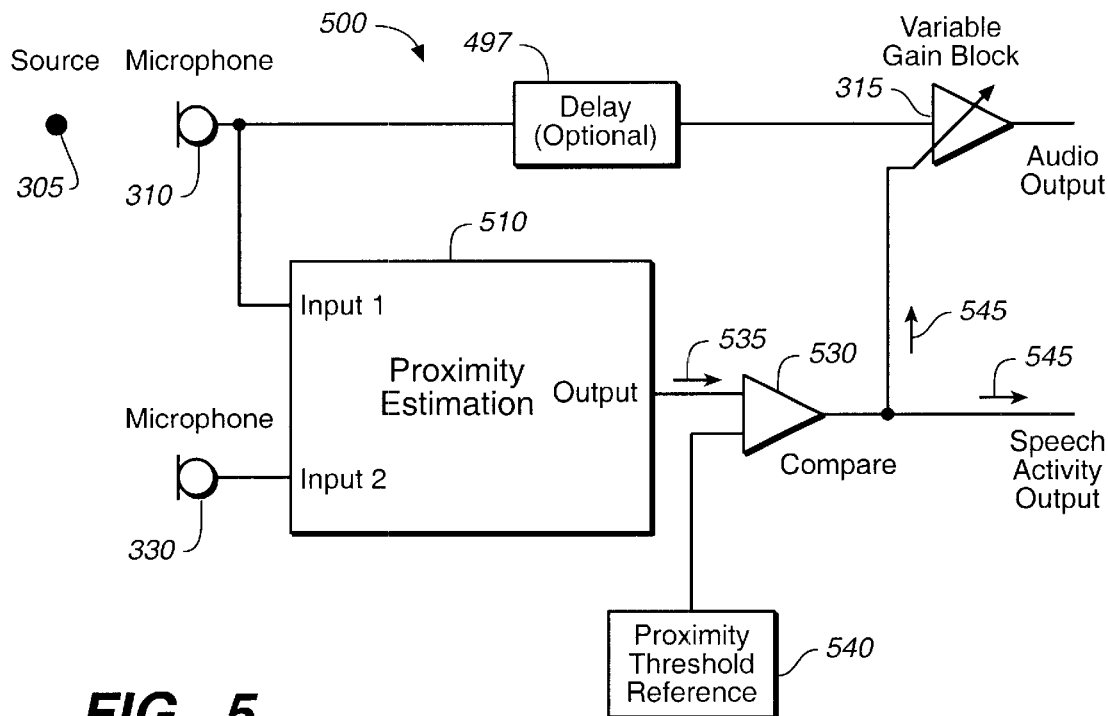
FIG._5
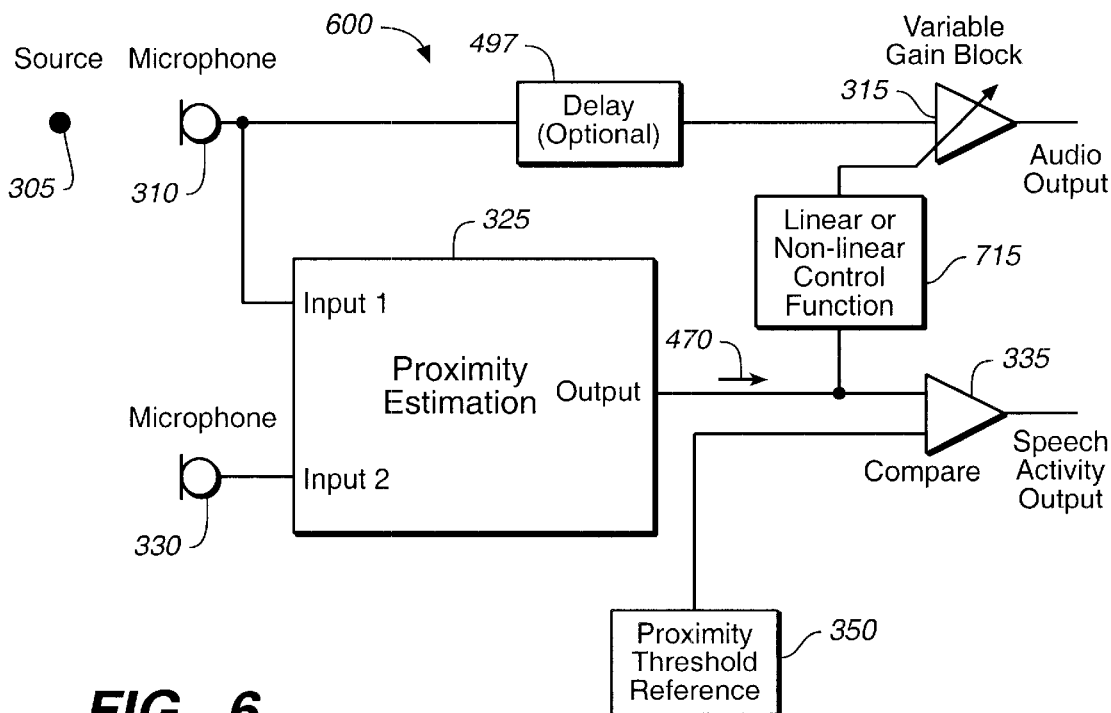
FIG._6

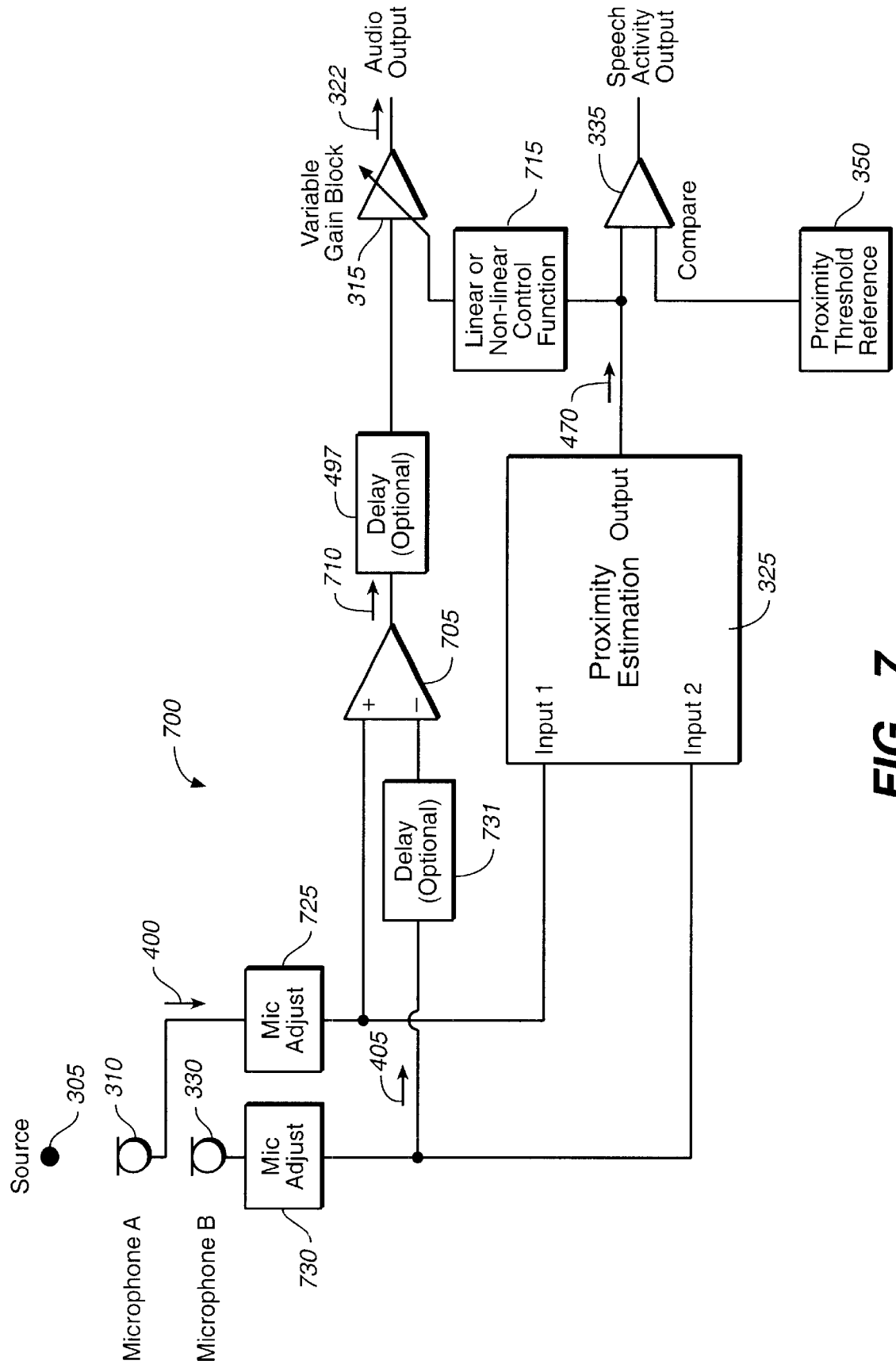
FIG._7

SIGNAL EXPANDER WITH DISCRIMINATION BETWEEN CLOSE AND DISTANT ACOUSTIC SOURCE

FIELD OF THE INVENTION

The present invention relates generally to the field of communications with possible uses in voice recognition, public address, and recording. The present invention relates more particularly to a signal expander system that can distinguish sounds from acoustic sources placed at different locations relative to a transducer.

BACKGROUND OF THE INVENTION

Conventional voice communication systems typically incorporate some form of voice activated switch or signal expander for suppressing acoustic background noises. FIG. 1A illustrates a functional block diagram of a conventional bi-stable signal expander system 100 comprising a microphone 105, an expander control stage 110, and a variable gain block (stage) 115. The microphone 105 is coupled to the variable gain block 115, and the expander control stage 110 is coupled to the microphone 105 and the variable gain block 115. The expander control stage 110 includes a detector 120 coupled between the microphone 105 and a first input 125 of a comparator 130. The comparator 130 has a second input 135 coupled to a reference (threshold) voltage source 140 for generating a reference voltage level Vref.

When an acoustic source 145 becomes active, the emitted sounds from acoustic source 145 will cause changes in the air pressure. The microphone 105 detects the air pressure changes and translates the air pressure changes into corresponding voltage changes (i.e., microphone output signals 150) that are detected by the detector 120. The detector 120 outputs the microphone output signal 150 as a detector output signal 155. The comparator 130 compares the voltage level of the detector output signal 155 with the reference voltage level Vref from reference voltage source 140. If the voltage level of the detector output signal 155 is below the reference voltage level Vref, then the comparator 130 generates an output signal 160 with a logical state that does not activate the variable gain block 115. As a result, the variable gain block 115 does not add gain to the microphone output signal 150. When the acoustic source 145 activates, the voltage level of the microphone output signal 150 rises. The detector 120 detects the higher-level microphone output signal 150 and will, as a result, output a higher-level detector output signal 155. If the voltage level of detector output signal 155 rises above the reference voltage level Vref, the comparator 130 outputs a control signal 160 with a logic state that causes the variable gain block 115 to add gain to the microphone output signal 150. The variable gain block 115 then outputs the amplified microphone output signal as an audio output signal 165.

A disadvantage of the bi-stable signal expander system 100 is that a low-level sound (e.g., soft speech) from the acoustic source 145 may not be amplified if the magnitude of the low level sound does not trigger the comparator 130. If the threshold of comparator 130 is set too low, then noise signals in the environment will easily trigger the comparator 130, thereby activating the variable gain block 115 and amplifying the noise signals ("noise pumping"). If the threshold of comparator 130 is set too high, then softer sounds from the acoustic source 145 may not trigger the comparator 130 and not activate the variable gain block 115, resulting in inadequate gain for the desired signal.

In order to reduce the consequence of low level speech failing to activate the comparator 130, some systems set the minimum gain of the variable gain block 115 to be only 12 dB to 20 dB below the maximum (fully activated) gain.

A disadvantage of the above conventional bi-stable signal expander systems is that ambient or undesired noises having magnitudes above the threshold level of comparator 130 are amplified. Additionally, if the bi-stable expander system 100 will be used in a noisy environment, the threshold of the comparator 130 must be set appropriately so that the external noises do not trigger the comparator 130, increasing the severity of noise modulation and increasing the likelihood that the system will not respond properly to voice.

Additionally, if the microphone 105 is oriented away from the acoustic or speech source 145, the microphone 105 may not be able to properly detect the desired sound waves. As a result, the microphone output voltage level 150 will be low and may not trigger the comparator 130 to permit amplification of the desired detected sound.

The above-mentioned bi-stable signal expander systems have a fast attack and slow decay characteristic that causes the switches for controlling gain to respond quickly to a detected sound of a sufficient voltage level and to maintain the gain for a pre-defined time length (e.g., 150 ms to 200 ms) after the voltage level of the detected sound falls below the comparator 130 threshold. By maintaining the gain for the additional pre-defined time length, the quieter-sounding, trailing ends of the speech envelope are not cut off by the bi-stable signal expander system. These trailing ends are typically below the comparator threshold. However, noise is often amplified during the additional pre-defined time length when gain is maintained.

The above-mentioned bi-stable signal expander systems also encounter problems when a burst of background noise occurs. For example, the noise burst might be a typewriter key impact or other types of noises with impulse waveforms. The noise burst will trigger the comparator 130 in the bi-stable signal expander system, thereby adding gain to the undesired noise burst. In addition, since the gain is maintained for the above-mentioned pre-defined time length after the noise burst occurrence, subsequent undesired noises are also amplified.

FIG. 1B illustrates a conventional variable gain signal expander system 200 including an expander control stage 205 coupled between the microphone 105 and the variable gain block 115. The expander control stage 205 includes a detector 210 coupled to an amplifier 215. The microphone output signal 150 is detected by the detector 210 and amplified by the amplifier 215. As a result, the amplifier 215 generates a control signal 220 with a magnitude that depends on the initial magnitude of the microphone output signal 150. The amount of gain provided by the variable gain block 115 to the microphone output signal 150 depends on the magnitude of the control signal 220.

The variable gain signal expander system 200 can be designed with a shorter time constant for reduced audibility of "noise pumping". The shorter time constant reduces the amount of time that high gain is applied to the noise signal as the desired signal drops in amplitude. The effect of the combination of variable gain with reduced time constants on the desired signal is to modulate the envelope of the speech signal. This is not generally desirable but may be an acceptable compromise in noisy environments.

A further disadvantage of the variable gain signal expander system 200 is that both the signal from the desired acoustic source and the ambient acoustic noise are detected and used to increase the gain of the variable gain block 115. Thus as the ambient noise levels increase, the gain of the system for this noise can also increase, resulting in less overall noise reduction.

Accordingly, it is desirable to provide a method and system for signal expansion with improved noise rejection capability.

SUMMARY OF THE INVENTION

The present invention provides a desirable method and system for discriminating between desired sounds from a near-field acoustic source and sounds (noise) from far-field acoustic sources. The invention advantageously prevents gain from being added to the undesired (far-field) loud noises while allowing gain to be added to low-level sounds from the desired (nearby) acoustic source. As a result, the invention can reduce the "noise pumping" problem that is encountered by conventional systems and methods.

The present invention can be used to enhance the noise rejection capability of headsets. Additionally, the invention may be used in other applications, such as handsets, as long as two microphones can be placed at different distances from an acoustic source. The invention may also be used to enhance the noise rejection capability of voice recognition, public address, and recording systems.

In one embodiment of the present invention, the signal expander system comprises an input block, a proximity estimation block (e.g., a ratio detector) coupled to the input block and a variable gain block coupled to the proximity estimation block. A speech activity detector may be optionally coupled to the proximity estimation block.

The input block has at least two inputs (such as two microphones) and three outputs (such a signal output and the individual outputs of each microphone). In one embodiment, the signal output of the input block is the same as the output of the first microphone. In another embodiment, each microphone output is coupled to a corresponding sensitivity adjustment block for closely matching the sensitivities of the microphones. Thus, the outputs of the microphones are derived from their corresponding sensitivity adjustment block. The signal output of the input block is derived from the difference between the outputs of the first microphone and the second microphone. This second embodiment results in a composite directional microphone from the microphone pair in the input block. This embodiment is essentially independent of the proximity issue between the microphones and the acoustic source, and is a convenient by-product of the above two microphone topology. The delay in the output signal from the second microphone alters the polar pattern from bi-directional to cardioid, supercardioid, or hypercardioid, depending on the amount of delay.

The proximity estimation block includes two inputs (from the microphones) and one output for generating the proximity estimation block output signal. As described below, differing degrees of signal conditioning may be applied in series with the input and output paths of the proximity estimation block. The proximity estimation (i.e., the distance between each microphone in the input block and the acoustic source) is made, for example, based on the ratio between the two inputs of the proximity estimation block. However, other methods may also be used to make the proximity estimation.

In one embodiment of the proximity estimation block, the first input permits the output signal of the first microphone to be received by one input of the divider, while the second input permits the output signal of the second microphone to be received by the other input of the divider. The output signal of the proximity estimation block is derived from the divider output signal.

Two types of signal conditioning blocks may be interposed on the input side of the divider. For example, filters may coupled to the divider input side to band-limit the signals received by the divider. Rectifying detectors may also be coupled to the divider input side to simplify the operation of the divider.

In one implementation, the divider is configured to take the difference of the logarithm of the divider input signals. This implementation is particularly suited to an analog implementation. The output of this implementation is the logarithm of the ratio. In some applications, the antilog of this ratio value may be taken. However, direct use of the log output frequently will result in better noise margins and permits use of simpler circuitry.

On the output side of the divider, a clipping and smoothing function may be inserted to reduce the effects of phase induced transients. This function may be implemented in either analog or digital form.

The variable gain block includes two inputs and one output and may be implemented in three basic forms, as described below. The first input of the variable gain block is the output signal from the input block. The second input of the variable gain block is from either the direct output of the proximity estimation block or from a speech activity detector having an output derived from the proximity estimation. The output of the variable gain block is the system audio output. All implementations of the variable gain block typically includes a variable gain amplifier or an attenuator, either of which is controlled directly or indirectly by the inputs to the proximity estimation block and may include components for controlling the timing of the gain changes. All implementations of the variable gain block may include a delay element on the block input to compensate for any delays introduced by the proximity estimation process.

One implementation of the variable gain block includes a conventional amplitude based expander where the gain of the variable gain block is determined by an input level when the proximity estimation indicates that the distance to the acoustic source is within a proscribed distance. Thus, the gain applied to the output of the first microphone is determined by both the level of the output signal itself and by the estimate of proximity (as determined by the proximity estimation block) exceeding a threshold value. The proximity estimate input to this implementation is binary regardless of the gain versus input level characteristics of the expander when activated.

A second implementation of the variable gain block includes a form of bi-stable expander that assumes a high or low gain state depending on the binary value of the proximity based speech activity detector. Thus, the output signal of the first microphone is amplified in response to the proximity estimate exceeding a threshold value.

A third implementation of the variable gain block includes a variable gain element providing a gain that is a function of the direct output of the proximity estimation block. The function may be: (i) linear, (ii) non-linear, (iii) logarithmic, or (iv) arbitrary. Thus, the gain provided to the output signal of the first microphone is a function of the direct output of the proximity estimation block. The second input of the variable gain block in this implementation is directly coupled to the output of the proximity estimation block.

The speech activity detector includes one input and one output. The detector input is connected to the output of the proximity estimation block and permits transmission of the proximity estimation block output signal to one input or a comparator. The other input of the comparator is a proximity reference value that establishes the limit of the distance within which the desired acoustic source is expected to be located. All acoustic sources more distant than this value will be considered as noise. The output of the comparator is the output of the speech activity detector and provides a binary indication of whether the desired acoustic source is active.

All embodiments of the present invention typically incorporate all four blocks (input block, proximity estimation block, variable gain block, and speech activity detector) in one of two general configurations depending on whether the variable gain block accepts the proximity estimate directly or uses the speech activity detector output. Any of the variations of the input block or the proximity estimation block can be optionally used for any embodiment disclosed herein. The speech activity detector is typically the same form in all embodiments. The variable gain block can be any of the three implementations mentioned above.

Additionally, the present invention provides a signal expander using digital processing to implement the functions mentioned above. In this embodiment of the invention, the output signals from the microphones in the input block are first digitized. Analog processes are replaced by digital arithmetic blocks and algorithms. This digital implementation also enables more sophisticated processes to be utilized without requiring additional hardware.

BRIEF DESCRIPTION OF THE DRAWINGS

FIG. 1A is a functional block diagram of a conventional bi-stable signal expander system.

FIG. 1B is a functional block diagram of a conventional variable gain signal expander system.

FIG. 2A is a functional block diagram of a signal expander system in accordance with an embodiment of the present invention.

FIG. 2B is an illustration of a telephone headset that can implement the present invention.

FIG. 2C is an illustration of a telephone handset that can implement the present invention.

FIG. 3 is a functional block diagram of an analog divider in accordance with the present invention.

FIG. 4A illustrates the simulated source waveform when the source is close to the first microphone.

FIG. 4B illustrates the output waveform of each microphone when the source is close to the first microphone.

FIG. 4C illustrates the detected output waveform of the signal from each microphone and the linear ratio, when the source is close to the first microphone.

FIG. 4D illustrates waveforms of the logarithm of the signal from each microphone and the difference between the logarithms, when the source is close to the first microphone.

FIG. 4E illustrates waveforms of the clipped and smooth logarithmic output which in some embodiments would represent the output of the proximity estimation block, when the source is close to the first microphone.

FIG. 4F illustrates the output waveform of each microphone when the source is distant from the first microphone.

FIG. 4G illustrates the detected output waveform of the signal from each microphone and the linear ratio, when the source is distant from the first microphone.

FIG. 4H illustrates waveforms of the logarithm of the signal from each microphone and the difference between the logarithms, when the source is distant from the first microphone.

FIG. 4I illustrates waveforms of the clipped and smooth logarithmic output which in some embodiments would represent the output of the proximity estimation block.

FIG. 5 is a functional block diagram of a signal expander system in accordance with another embodiment of the present invention.

FIG. 6 is a functional block diagram of a signal expander system in accordance with another embodiment of the present invention.

FIG. 7 is a functional block diagram of a signal expander system in accordance with another embodiment of the present invention.

DETAILED DESCRIPTION OF THE PREFERRED EMBODIMENTS

Those of ordinary skill in the art will realize that the following description of the preferred embodiments is illustrative only and not in any way limiting. Other embodiments of the invention will readily suggest themselves to those skilled in the art.

FIG. 2A illustrates a functional block diagram of a signal expander system 300 in accordance with a first embodiment of the present invention. The system 300 is advantageously not activated by far-field noises and allows the use of a lower threshold within the expander control section 320 to better pick up low level speech. The signal expander system 300 is capable of detecting the signals generated by an acoustic source 305 and includes a first microphone 310 coupled to a variable gain block (stage) 315 and to an expander control stage 320. The expander control stage 320 is also coupled to the variable gain block 315. The expander control stage 320 may be implemented by, for example, the conventional expander control stage 205 used in the conventional variable gain signal expander system 200, as shown in FIG. 1B. The variable gain block 315 produces the audio output signals 322.

The signal expander system 300 further includes a proximity estimation block 325 that is coupled to the first microphone 310 and to a second microphone 330. A speech activity detector (comprising a comparator 335) has a first input 340 coupled to the proximity estimation block 325 output and a second input 345 coupled to a reference (proximity) voltage source 350. Thus, the second input 345 receives the reference voltage level Vref from the reference voltage source 350. The reference source 350 is a proximity threshold, which determines whether the acoustic source that is producing a signal is a near-field or far-field source. The reference source 350 then disables the expander system 300 if a near-field source is not active. The comparator 335 may enable or disable the expander control stage 320 by use of, for example, a conventional transistor switch (not shown). The comparator 335 may also be coupled to a subsequent stage (not shown) for receiving the speech activity detector output and for processing detected speech activity.

In a preferred embodiment, the proximity estimation block 325 includes a divider 360 coupled to the first input 340 of the comparator 335. The divider 360 computes the ratio of both microphone output signals 400 and 405. Since the microphone output signals 400 and 405 are each determined by air pressure, the divider 360 is also effectively comparing the ratio of the air pressures at first microphone 310 and second microphone 330. An analog implementation of the divider is discussed below with reference to FIG. 3. The divider 360 has a first input 365 coupled to a first detector 370 and a second input 375 coupled to a second detector 380. A first band-pass filter 385 is coupled between the first microphone 310 and the first detector 370. A second band-pass filter 390 is coupled between the second microphone 330 and the second detector 380. In an alternative embodiment, the band-pass filters 385 and 390 may be replaced with high-pass filters. In yet another alternative embodiment, the band-pass filters 385 and 390 may be omitted so that the first microphone 310 is directly coupled to the first detector 370 and the second microphone 330 is directly coupled to the second detector 380. The functionality of the divider 360, detectors 370 and 380, and band-pass filters 385 and 390 are discussed below in additional detail.

In the various possible implementations of the present invention, the first microphone 310 is closer than the second microphone 330 in distance to the desired acoustic source 305. For example, the present invention may be implemented in a headset 392 (FIG. 2B) or handset 394 (FIG. 2C) wherein the first microphone 310 is placed near the user's mouth and the second microphone 330 is placed near the user's ear. Alternatively, the first microphone 310 may be placed on a headset boom, while the second microphone 330 is placed on, for example, a desk near the headset. As another alternative, the first microphone 310 may be placed near an acoustic source 305 in a room, while the second microphone 330 may be placed at a slightly further distance from the acoustic source 305. Other configurations are possible so that the first microphone 310 is closer than the second microphone 330 in distance from the acoustic source 305. By placing the first microphone 310 and the second microphone 330 at different distances from the acoustic source 305, the principle of the "inverse square law" is utilized. According to the inverse square law, the sound power detected at a given location from an acoustic source is inversely proportional to the square root of the distance between the given location and the acoustic source. Since sound pressure is proportional to the square root of sound power, sound pressure at the given location is inversely proportional to the distance between the given location and the acoustic source.

As further shown in FIG. 2A, the detector 370 detects the microphone output signal 400, while the detector 380 detects the microphone output signal 405. While it is possible to determine the average ratio of instantaneous acoustic pressures and use this information to estimate source proximity, in practice it is easier to smooth the waveform with rectifying detectors 370 and 380. The detectors 370 and 380 must be well matched in gain and time response. The attack and release times should also be fast enough to follow the envelopes of the respective signals 400 and 405 but slow enough to smooth the waveform in the frequency band of interest.

The difference in path length from the desired acoustic source 305 to microphones 310 and 330 results in the peaks in the detected response in detectors 370 and 380 to be somewhat displaced in time. This, in turn, causes the calculated ratio to fluctuate. Smoothing the peaks results in a reduction in the amount of ripple in the calculated ratio.

It is desirable to further smooth the output of the divider 360 to prevent false triggering on the onset or end of a signal produced by a distant sound source. This occurs because during the time between the arrival of a sound at either microphone and its arrival at the other microphone, the ratio is calculated using the response of the first microphone 310 to the received signal and the noise floor of the other microphone 330. This can result in very large ratios, either greater or less than one (1), depending on which microphone is stimulated first. (This is determined by the direction of the acoustic source 305). Note that this is true even if the time-aligned ratio is equal to unity. Once the signal ends, a similar situation occurs since one microphone continues to be stimulated for a brief interval after stimulation of the other microphone has ceased. This transient is in the direction of the reciprocal of the initial transient. Any known suitable component for inhibiting response to these transients and limiting abrupt changes in gain will improve the performance of the signal expander system of the present invention.

Referring now to FIG. 3, an analog implementation of the divider 360 is shown. A first logarithmic amplifier 450 is coupled between the positive (+) input of a differential amplifier 455 and the detector 370 (FIG. 2A). A second logarithmic amplifier 460 is coupled between the negative (−) input of differential amplifier 455 and the detector 380 (FIG. 2A). An anti-logarithmic amplifier 465 may be optionally coupled to the differential amplifier 455 output. The use of the logarithmic amplifiers 450 and 460 enables the differential amplifier 455 to produce a signal 470 proportional to the ratio of the magnitude of the input signals and improves the resolution of the proximity threshold estimation. The output signal 470 is generated either directly from the differential amplifier 455 output or the anti-logarithmic amplifier. 465 output, depending on whether or not the anti-logarithmic amplifier 465 is implemented. The anti-log amplifier 465 changes the characteristic of the output signal 470 for processing by a subsequent stage such as comparator 335 (FIG. 2A). The output signal 470 indicates the ratio of the magnitudes of the microphone output signals 400 and 405 (FIG. 2A).

Referring again to FIG. 2A, the divider 360 generates the output signal 470 that depends on the ratio of the magnitudes of microphone output signals 400 and 405. The magnitude of the output signal 470 increases when the pressure at microphone 310 increases relative to microphone 330 but is independent of the absolute magnitude of the signals as long as the ratio between them remains constant. The comparator 335 compares the magnitude of the output signal 470 with the reference voltage level Vref from the reference voltage source 350. The precise voltage of Vref produced by reference source 350 is dependent upon specific circuit values but would typically be set to equal the voltage produced by the output signal 470 when the desired acoustic source 305 is at the maximum distance (under conditions of normal use) from the microphones 310 and 330. However, the reference voltage source 350 may be set to other values, based upon the expected noise level in the environment, the type of sounds generated by the acoustic source 305, the relative distance between the microphones 310 and 330 from the acoustic source 305, and/or other factors. If, for example, the microphones 310 and 330 are implemented in the headset 392 (FIG. 2B) or handset 394 (FIG. 2C), then the relative distance between the microphones 310 and 330 from the acoustic source 305 (e.g., the speaker's mouth) can be determined.

When the acoustic source 305 is inactive, the microphone output signals 400 and 405 will be approximately equal in magnitude and will be voltage representations of ambient (far-field) noise that are detected by the microphones 310 and 330, respectively. Thus, the output signal 470 will be approximately unit one in value. Assume that the reference voltage level Vref is set at a magnitude slightly above unit one. Since the magnitude of the output signal 470 is below the reference voltage level Vref, the comparator 335 will generate an output signal 490 with a low level, thereby not enabling the expander control stage 320. Since the expander control stage 320 is not enabled, the variable gain block 315 does not add gain to the microphone output signal 400.

Assume that a noise burst occurs in the environment in which the signal expander system 300 is located. The noise burst is detected by the second microphone 330 and, as a result, the magnitude of microphone output signal 405 will increase. The noise burst is also detected by the first microphone 310. However, the air pressure due to the noise burst will be approximately equal at the locations of first microphone 310 and second microphone 330, based on the inverse square law. The above approximation is based on the assumption that both microphones 310 and 330 can be treated as being approximately equal in distance from the source of the far field noise. As a result, the magnitudes of the microphone output signal 400 and microphone output signal 405 will be approximately equal. Therefore, the proximity estimation block 325 will generate an output signal 470 that is approximately unity or less than unity in value. Since the magnitude of output signal 470 will be less than the reference voltage level Vref, the comparator output signal 490 will have a zero or low value, thereby disabling the expander control stage 320. Since the expander control stage 320 is not enabled, the variable gain block stage 315 does not add gain to noise burst detected by the first microphone 310.

Assume that the acoustic source 305 becomes active. For example, the acoustic source 305 may be the speaker's mouth. The acoustic source 305 becomes active when the speaker starts to speak. Since the acoustic source 305 is active, the microphone output signal 400 of first microphone 310 will increase in magnitude where the first microphone 310 is disposed near the acoustic source 305. The amount of difference between the sound pressures is dependent on the relative distances between the desired source and each microphone. The sound pressure from the acoustic source 305 will not be as high at the second microphone 330 due to the greater distance of that microphone from the desired acoustic source 305. As a result, the magnitude of output signal 470 will increase and rise above the reference voltage level Vref. Since the magnitude of the output signal 470 is greater than Vref, the comparator 335 will generate a comparator output signal 490 with a high or non-zero value, thereby enabling the expander control stage 320. In some implementations with closely spaced microphones, the difference between the microphone output levels will be relatively small but the difference is still measurable.

The operation of the expander control stage 320 is previously described above with reference to FIG. 1B. The expander control stage 320 generates a gain control signal 495 that controls the gain provided by the variable gain block 315 and that has a value dependent on the magnitude of the microphone output signal 400. Based on the value of gain control signal 495, the variable gain block 315 will provide a corresponding amount of gain to the microphone output signal 400. The resulting amplified microphone output signal or audio signal 322 is then produced by the variable gain block 315. The gain provided by block 315 may be linear, logarithmic, or other non-linear function.

The gain curve of the variable gain block 315 is preferably based on psycho-acoustic principles and may, for example, be linear, logarithmic, or non-linear. As an option, the gain increase and/or gain decrease provided by the variable gain block 315 is gradual.

Any sound that has a significantly higher pressure at a position near first microphone 310 (when compared to a position near the second microphone 330) is presumed to be the desired sound from the acoustic source 305. The proximity estimation block 325, therefore, permits this desired sound to receive an increased gain from variable gain block 315. Any sound that has an equal or lower pressure at a position near the first microphone 310 (when compared to a position near the second microphone 330) is presumed to be noise. The proximity estimation block 325, therefore, will not permit the variable gain block 315 to amplify the noise.

It is further noted that an optional delay element 497 may be implemented along the path of signal 400 to compensate for delays in the ratio detection process, particularly in a digital implementation.

As stated above, a conventional subsequent stage (not shown) may also receive the comparator output signal 490 for subsequent processing. For example, the subsequent stage may be a conventional device for suppressing side tones. When the comparator output signal 490 is at a high level, the subsequent stage may set a particular volume level so that side tones are suppressed, as the speaker is speaking at the first microphone 310. If the comparator output signal 490 is at a low level, the subsequent stage may set another volume level that is not required for side tone suppression.

The subsequent stage may also be other downstream modules or applications such as a conventional speech recognition circuit. The comparator output signal 490 may be used by a speech recognition circuit as an enable signal for translating speech sounds from first microphone 310 into text on a computer screen (not shown). When the comparator output signal 490 is zero in value, the speech recognition application is prevented from erroneously translating ambient noise detected by first microphone 310 into text on the computer screen.

In a preferred configuration, the rectifying detectors 370 and 380 are used to simplify the subsequent divider stage 360. Without rectification, the divider 360 must operate in all four quadrants (i.e., with numerator, denominator, and output being allowed to be positive or negative). The design of such a divider is unnecessarily complex for this application. Rectification of the divider input signals allows the divider to operate in a single quadrant and results in a simpler circuit.

The band-pass filters 385 and 390 may be set so that only frequencies occurring in the speech envelope are passed through the proximity estimation block 325. Typically, the frequency range of the band-pass filters would be about 200 Hz to 7 kHZ for speech applications. Reducing the upper cut-off frequency to 700 Hz would help reduce some of the ripple in the ratio detection. It is preferable that filters 385 and 390 be well-matched in gain and frequency response. The low frequency noise will be filtered by the band-pass filters 385 and 390, thereby making the signal expander system 300 more robust for speech detection and noise rejection.

Reference is now made to the waveform diagrams in FIGS. 4A to 4I. FIG. 4A shows a waveform 480 which represents a simulated output of acoustic source 305 (FIG. 2A). The waveform 480 is shown as a function of pressure versus time (milliseconds). FIGS. 4B to 4E illustrate various waveforms when the acoustic source 305 is close to the first microphone 310. FIG. 4B shows the output waveform diagrams of each microphone 310 and 330 as a function of pressure versus time. The waveform 400 is the output of the first microphone 310 (FIG. 2A), while the waveform 405 is the output of the second microphone 330 (FIG. 2A). The axis denoted as "Mic 1 Pressure" is the pressure at the first microphone 310, while the axis denoted as "Mic 2 Pressure" is the pressure at the second microphone 330.

The waveform 405 is delayed approximately 0.284 milliseconds relative to the waveform 400, for a path length difference of approximately 97.6 millimeters between the first microphone 310 and the second microphone 330. It is noted that in the examples of FIGS. 4B to 4E, an attenuation of approximately 13.81 dB of the waveform 400 (from the first microphone 310) corresponds to a distance of approximately 25.0 millimeters of the first microphone 310 from the acoustic source 305, with an angle of approximately 90 degrees relative to the axis between microphones 310 and 330 and approximately 120 millimeters of spacing between the microphones.

FIG. 4C shows waveform diagrams of the detected output signals from each microphone 310 and 330 and the linear ratio 470a from the divider 360 (FIG. 2A). The linear ratio 470a is shown as a function of the ratio value versus time. The waveform 400a is received by the first input 365 and the waveform 405a is received by the second input 375 of the divider 360. The waveform 400a and waveform 405a are each shown as smoothed absolute values of signals from their respective microphones.

FIG. 4D shows the logarithm 400b of the smoothed absolute value of waveform 400a and the logarithm 405b of the smoothed absolute value of waveform 405a. These logarithmic signals are generated by the logarithmic amplifier 450 and logarithmic amplifier 460, respectively, of FIG. 3. The waveform 470b is the difference of the logarithms 400b and 405b, and is generated by the differential amplifier 455 of FIG. 3.

FIG. 4E shows the output waveforms from the proximity estimation block 325 (FIG. 2A) when the acoustic source 305 is close to the first microphone 310. The waveform 470a is the output of proximity estimation block 325 with the output signal from divider 360 (FIG. 2A) clipped at 20 dB. The waveform 470b is the output of proximity estimation block 325 with the output signal clipped at 20 dB and then smoothed by filtering (by use of clip and filter block 395 in FIG. 2A).

FIGS. 4F and 4I illustrate various waveforms when the acoustic source 305 is distant from the first microphone 310. FIG. 4F shows the output waveform diagrams of each microphone 310 and 330 as a function of pressure versus time. The waveform 405 is delayed approximately 0.007 milliseconds relative to the waveform 400, for a path length difference of approximately 2.40 millimeters between the first microphone 310 and the second microphone 330. It is noted that in the examples of FIGS. 4F to 4I, an attenuation of approximately 0.01 dB of the waveform 400 corresponds to a distance of approximately 3.0 meters of the first microphone 310 from the acoustic source 305, with an angle of approximately 90 degrees relative to the axis between microphones 310 and 330 and approximately 120 millimeters of spacing between the microphones.

FIG. 4G shows waveform diagrams of the detected output signals from each microphone 310 and 330 and the linear ratio 470a from the divider 360 (FIG. 2A). The waveform 400a (to input 365 in FIG. 2A) and the waveform 405a (to input 375) are substantially overlapping, and are each shown as smoothed absolute values of signals from their respective microphones.

FIG. 4H shows the logarithm 400b of the waveform 400a and the logarithm 405b of the waveform 405a of FIG. 4G. The waveform 470b is the difference of the logarithms 400b and 405b in FIG. 4H.

FIG. 4I shows the output waveforms from the proximity estimation block 325 (FIG. 2A) when the acoustic source 305 is distant from the first microphone 310. The waveform 470a is the output of proximity estimation block 325 with the ratio signal from the divider 360 (FIG. 2A) clipped at 20 dB. The waveform 470b is the output of proximity estimation block 325 with the output signal clipped at 20 dB and then smoothed by filtering.

FIG. 5 illustrates a signal expander system 500 in accordance with another embodiment of the present invention. The signal expander system 500 is a digital implementation that would convert the signals at the microphones 310 and 330 and implement the same functional blocks described above in a digital signal processor (DSP). Analog processes are replaced by digital arithmetic blocks and algorithms. The digital implementation shown in FIG. 5 also enables more sophisticated processes to be utilized without requiring additional hardware. The signal expander system 500 includes an analog-to-digital (A/D) converter (not shown) coupled between each of the microphones 310 and 330 and the proximity estimation block 510. The A/D converters convert the output of microphones 310 and 330, respectively, into digital form.

A digital comparator 530 compares the values of the output signal 535 from proximity estimation block 510 with a threshold value Vref(digital) from a threshold register 540. The digital comparator 530 will generate a comparator output signal 545 with a logical one value if the value of output signal 535 is greater than the threshold value Vref (digital). The comparator output signal 545 is then used for controlling the variable gain block 315.

FIG. 6 illustrates a signal expander system 600 in accordance with another embodiment of the present invention. The output signal 470 from proximity estimation block 325 is fed into a control function block 715 for permitting linear, logarithmic, or non-linear gain to be provided by the variable gain block 315. The control function block 715 has been shown as a separate element in order to assist in explaining the functionality of the present invention. However, the block 715 may be implemented within the variable gain block 315. The block 715 may also be implemented in the variable gain block 315 shown in FIGS. 2A and 5.

FIG. 7 illustrates a signal expander 700 in accordance with another embodiment of the present invention. The positive input terminal (+) of a differential amplifier 705 receives the microphone output signal 400 from first microphone 310. The negative input terminal (−) of differential amplifier 705 receives the microphone output signal 405 from the second microphone 330. The differential amplifier 705 generates the output differential signal 710 which is an amplification of the difference between the microphone output signals 400 and 405. Therefore, the microphones 310 and 330 are both used for providing the acoustical output 322 of signal expander 700. The second microphone 330 is being used to create a second order (bi-directional or gradient) microphone for increased noise rejection capability by the signal expander 700. In this embodiment, the microphones are closely spaced and located in a common housing (not shown). This method of creating a directional microphone is well established and confers the advantages of the use of a directional microphone in suppressing background noise in addition to attaining the advantages of the signal expander circuit.

The output differential signal 710 from differential amplifier 705 is amplified by the variable gain block 315. The amount of amplification provided by the variable gain block 315 depends on the output signal 470 from proximity estimation block 325. The output signal 470 can be fed directly as a gain control signal to the variable gain block 315, or fed into the control function block 715 as previously described above.

The signal expander system 700 may optionally include microphone adjustment stages 725 and 730 coupled to the first microphone 310 and second microphone 330, respectively. The microphone adjustment stages 725 and 730 permit the sensitivities of microphones 310 and 330 to be adjusted and substantially matched. In other words, the microphone adjustment stages 725 and 730 permit the microphones 310 and 330 to be equally sensitive to sound. The microphone adjustment stages 725 and 730 may also be implemented in the above-mentioned signal expander systems in accordance with the present invention.

In addition, an optional delay stage 731 may be coupled between microphone adjustment stage 730 and the negative (−) input of differential amplifier 705. The delay stage 731 compensates for the delay between the output signals of the microphones 310 and 330.

For each of the above-mentioned embodiments of the signal expander systems in accordance with the present invention, the direction of the acoustic source 305 is preferably known so that it can be determined which microphone is nearest to the acoustic source 305. Additionally, for each of the above-mentioned signal expander systems, the microphones 310 and 330 are preferably omni-directional microphones. Alternatively, the microphones 310 and 330 can be bi-directional microphones or cardioid unidirectional microphones, as long as the patterns and sensitivities of both microphones are substantially matched. The microphone adjustment stages 725 and 730 in FIG. 7 may be coupled to the microphones 310 and 330, respectively, for matching the microphone sensitivities. As a further alternative, the microphone nearest the acoustic source 305 (e.g., first microphone 310) may be set at a higher gain level than the microphone further from the acoustic source 305. As a result, the signal expander systems in accordance with the present invention can further have increased ambient noise rejection capability.

The analog signal expander systems in FIGS. 6 and 7 may also be modified in a digital implementation. Analog-to-digital converters may be coupled to the microphone 310 and 330 outputs, and a digital divider may be used to determine the ratio of the digitized microphone outputs, as similarly described above with reference to FIG. 5.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

What is claimed is:

1. An apparatus for discriminating between signals produced by a desired acoustic source and an undesired acoustic source, the apparatus comprising:

a first microphone disposed at a first distance from the desired acoustic source;

at least a second microphone disposed at a second distance from the desired acoustic source;

a proximity estimation block configured to utilize signals from the first microphone and second microphone to produce a signal representing an estimate of the proximity of the desired acoustic source based upon a ratio of signals produced by the first microphone and the second microphone; and a variable gain block configured to adjust the gain of the output signal from at least one of the microphones by utilizing the estimate of the proximity of the desired acoustic source.

2. The apparatus of claim 1 wherein the output signal from the first microphone is amplified by a gain amount dependent on the magnitude of the estimate of the proximity.

3. The apparatus of claim 1 wherein the output signals from the microphones are filtered in the frequency domain prior to estimation of the proximity.

4. The apparatus of claim 1 wherein the ratio is used as an indicator of speech activity for use in a subsequent processing stage.

5. The apparatus of claim 4 wherein the subsequent processing stage is configured to suppress side tones in response to a predetermined value of the estimate of proximity.

6. The apparatus of claim 4 wherein the subsequent processing stage includes a speech recognition circuit that is enabled in response to a predetermined value of the estimate of proximity.

7. The apparatus of claim 1 wherein the amplification provided to the output of the first microphone is a linear function of the ratio.

8. The apparatus of claim 1 wherein the amplification provided to the output of the first microphone is a logarithmic function of the ratio.

9. The apparatus of claim 1 wherein the amplification provided to the output of the first microphone is a non-linear function of the ratio.

10. The apparatus of claim 1 wherein the proximity estimation block includes a divider for receiving and processing the output signals from the microphones to generate the signal representing an estimate of the proximity of the desired acoustic sources.

11. The apparatus of claim 10 wherein the divider is configured to take the difference of the logarithm of the output signals from the microphones.

12. The apparatus of claim 10 wherein the divider includes an anti-log amplifier for generating an antilog value of the difference of the logarithm of the output signals from the microphones.

13. The apparatus of claim 10 further comprising a pair of detectors coupled to input terminals of the divider and configured to permit the divider to operate in a single quadrant.

14. The apparatus of claim 10 further comprising a pair of band-pass filters coupled to input terminals of the divider and configured to pass frequencies occurring within a predetermined range.

15. The apparatus of claim 10 further comprising a clipping and smoothing block coupled to an output terminal of the divider and configured to clip and filter the output signal of the divider.

16. The apparatus of claim 1 further comprising a delay stage for compensating for delays in the proximity estimation before amplification of the output of the first microphone.

17. The apparatus of claim 1 wherein the proximity estimation block comprises a digital signal processor for producing a signal representing an estimate of the proximity of the desired acoustic source.

18. A method of discriminating between signals produced by a desired acoustic source and an undesired acoustic source, comprising:

using a first microphone disposed at a distance from the desired acoustic source;

using a second microphone disposed at a second distance from the desired acoustic source;

utilizing signals from the first microphone and second microphone to produce an output signal representing an estimate of the proximity of the desired acoustic source based upon a ratio of signals produced by the first microphone and the second microphone; and adjusting the gain of the signal from at least one of the first and second microphones by utilizing the estimate of the proximity of the desired acoustic source.

19. The method of claim 18 wherein the signal from the first microphone is amplified in response to the estimate of the proximity exceeding a threshold value.

20. The method of claim 18 wherein the signal from the first microphone is amplified by a gain amount dependent upon the magnitude of the estimate of the proximity.

21. The method of claim 18 further comprising:

compensating for delays prior to amplification of the output signal from the first microphone to correct for delays due to the estimation of the proximity.

22. The method of claim 18 wherein the output signals from the microphones are filtered in the frequency domain prior to estimating the proximity.

23. The method of claim 18 further comprising:

using the estimate of proximity as an indicator of speech activity for use in a subsequent processing stage.

24. The method of claim 18 wherein the amplification provided to the output of the first microphone is a linear function of the estimate of proximity.

25. The method of claim 18 wherein the amplification provided to the output of the first microphone is a logarithmic function of the estimate of proximity.

26. The method of claim 18 wherein the amplification provided to the output of the first microphone is a non-linear function of the estimate of proximity.

27. An apparatus for discriminating between signals produced by a desired acoustic source and an undesired acoustic source, the apparatus comprising:

an input block including a first microphone disposed at a first distance from the desired acoustic source and a second microphone disposed at a second distance from the desired acoustic source;

a proximity estimation block coupled to the input block and configured to produce an estimate of the proximity of the desired acoustic source based upon output signals of the microphones;

a speech activity detector coupled to the proximity estimation block and configured to produce a control signal in response to the estimate of the proximity;

a differential amplifier having inputs coupled to the first microphone and the second microphone and having an output;

a variable gain block coupled to the output of the differential amplifier and the proximity estimation block, and configured to adjust the gain of the output signal from the differential amplifier based upon the estimate of the proximity; and a microphone adjustment stage coupled to each of the microphones, the microphone adjustment stage permitting the sensitivities of the microphones to be adjusted and substantially matched.

28. The apparatus of claim 27 wherein the estimate of the proximity is based upon the ratio of the output signals produced by the microphones.

29. The apparatus of claim 27 wherein the speech activity detector comprises a comparator having a first input coupled to the proximity estimation block, a second input coupled to a proximity threshold reference source, and an output for producing an speech activity output signal.

30. The apparatus of claim 27 further comprising a delay stage coupled between the first microphone and the variable gain block, and configured to compensate for delays provided by the proximity estimation block.

31. The apparatus of claim 27 wherein the amplification provided to the output of the first microphone is a linear function of the estimate of the proximity.

32. The apparatus of claim 27 wherein the amplification provided to the output of the first microphone is a non-linear function of the estimate of proximity.

33. The apparatus of claim 27 wherein the proximity estimation block comprises a digital signal processor for producing the estimate of the proximity.

34. An apparatus for discriminating between signals produced by a desired acoustic source and an undesired acoustic source, the apparatus comprising:

a first microphone disposed at a first distance from the desired acoustic source;

at least a second microphone disposed at a second distance from the desired acoustic source;

a proximity estimation block configured to utilize signals from the first microphone and second microphone to produce a signal representing an estimate of the proximity of the desired acoustic source;

a variable gain block configured to adjust the gain of an output signal from at least one of the microphones by utilizing the estimate of the proximity of the desired acoustic source; and a speech activity detector coupled to the proximity estimation block and to the variable gain block, and configured to indicate the presence of desired signals from the desired acoustic source.

35. An apparatus for discriminating between signals produced by a desired acoustic source and an undesired acoustic source, the apparatus comprising:

an input block including a first microphone disposed at a first distance from the desired acoustic source and a second microphone disposed at a second distance from the desired acoustic source;

a proximity estimation block coupled to the input block and configured to produce an estimate of the proximity of the desired acoustic source based upon output signals of the microphones;

a speech activity detector coupled to the proximity estimation block and configured to produce a control signal in response to the estimate of the proximity; and a variable gain block coupled to the input block and the speech activity detector, and configured to adjust the gain of the output signal from at least one of the microphones based upon the estimate of the proximity.

36. The apparatus of claim 35 wherein the estimate of the proximity is based upon the ratio of the output signals produced by the microphones.

37. The apparatus of claim 35 wherein the speech activity detector comprises a comparator having a first input coupled to the proximity estimation block, a second input coupled to a proximity threshold reference source, and an output coupled to the variable gain block.

38. The apparatus of claim 35 further comprising a delay stage coupled between the first microphone and the variable gain block, and configured to compensate for delays provided by the proximity estimation block.

39. The apparatus of claim 35 wherein the proximity estimation block comprises a digital signal processor for producing the estimate of the proximity.

40. An apparatus for discriminating between signals produced by a desired acoustic source and an undesired acoustic source, the apparatus comprising:
    a first microphone disposed at a first distance from the desired acoustic source;
    at least a second microphone disposed at a second distance from the desired acoustic source;
    a proximity estimation block configured to utilize signals from the first microphone and second microphone to produce a signal representing an estimate of the proximity of the desired acoustic source; and
    a variable gain block configured to adjust the gain of an output signal from at least one of the microphones by utilizing the estimate of the proximity of the desired acoustic source, wherein the gain applied to the output signal from the first microphone is determined by both the level of output signal and by the estimate of the proximity exceeding a threshold value.

41. The apparatus of claim 40 wherein the output signal from the first microphone is amplified in response to the estimate of the proximity exceeding the threshold value.

42. A method of discriminating between signals produced by a desired acoustic source and an undesired acoustic source, comprising:
    using a first microphone disposed at a distance from the desired acoustic source;
    using a second microphone disposed at a second distance from the desired acoustic source;
    utilizing signals from the first microphone and second microphone to produce an output signal representing an estimate of the proximity of the desired acoustic source; and
    adjusting the gain of the signal from at least one of the first and second microphones by utilizing the estimate of the proximity of the desired acoustic source wherein the gain applied to the signal from the first microphone is determined by a level of the signal and by the estimate of the proximity exceeding a threshold value.

43. An apparatus for discriminating between signals produced by a desired acoustic source and an undesired acoustic source, the apparatus comprising:
    an input block including a first microphone disposed at a first distance from the desired acoustic source and a second microphone disposed at a second distance from the desired acoustic source;
    a proximity estimation block coupled to the input block and configured to produce an estimate of the proximity of the desired acoustic source based upon output signals of the microphones;
    a speech activity detector coupled to the proximity estimation block and configured to produce a control signal in response to the estimate of the proximity; and
    a variable gain block coupled to the input block and the proximity estimation block, and configured to adjust the gain of the output signal from at least one of the microphones based upon the estimate of the proximity.

44. The apparatus of claim 43 wherein the estimate of the proximity is based upon the ratio of the output signals produced by the microphones.

45. The apparatus of claim 43 wherein the speech activity detector comprises a comparator having a first input coupled to the proximity estimation block, a second input coupled to a proximity threshold reference source, and an output for producing an speech activity output signal.

46. The apparatus of claim 43 further comprising a delay stage coupled between the first microphone and the variable gain block, and configured to compensate for delays provided by the proximity estimation block.

47. The apparatus of claim 43 wherein the amplification provided to the output of the first microphone is a linear function of the estimate of the proximity.

48. The apparatus of claim 43 wherein the amplification provided to the output of the first microphone is a non-linear function of the estimate of proximity.

49. The apparatus of claim 43 wherein the proximity estimation block comprises a digital signal processor for producing the estimate of the proximity.

50. A method of discriminating between signals produced by a desired acoustic source and at least one undesired acoustic source, the method comprising:
    using a first microphone disposed at a distance from the desired acoustic source;
    using a second microphone disposed at a greater distance from the desired acoustic source and bearing a known relationship to the first microphone;
    adjusting sensitivities of the first and second microphones to be substantially matched;
    utilizing the output signals from the first microphone and the second microphone to produce a signal representing an estimate of the proximity of the desired acoustic source in an active state;
    producing an output based on the difference between the instantaneous values of the output signals from the first microphone and the second microphone in order to produce a composite output with the properties of a directional microphone; and
    adjusting a gain of the output based on the difference between the instantaneous values of the output signals from the first microphone and the second microphone by use of the estimate of the proximity of the desired acoustic source.

51. The method of claim 50 further comprising:
    filtering in the frequency domain the output signals from the first microphone and the second microphone prior to the estimation of the proximity.

52. The method of claim 53 further comprising:
    digitizing the output signals of the first microphone and the second microphone prior to processing the output signals.

53. An apparatus for discriminating between signals produced by a desired acoustic source and an undesired acoustic source, comprising:
    a first microphone disposed at a distance from the desired acoustic source;
    a second microphone disposed at a second distance from the desired acoustic source;
    means, coupled to the first microphone and second microphone, for utilizing signals from the first microphone and second microphone to produce an output signal representing an estimate of the proximity of the desired acoustic source based upon a ratio of signals produced by the first microphone and the second microphone; and
    means, coupled to the utilizing means, for adjusting the gain of the signal from at least one of the first and second microphones by utilizing the estimate of the proximity of the desired acoustic source.

54. An apparatus for discriminating between signals produced by a desired acoustic source and at least one undesired acoustic source, the method comprising:
   a first microphone disposed at a distance from the desired acoustic source;
   a second microphone disposed at a greater distance from the desired acoustic source and bearing a known relationship to the first microphone;
   means, coupled to the first microphone and second microphone, for utilizing the output signals from the first microphone and the second microphone to produce a signal representing an estimate of the proximity of the desired acoustic source in an active state;
   means, coupled to each of the microphones, for permitting sensitivities of the microphones to be adjusted and substantially matched;
   means, coupled to the first microphone and second microphone, for producing an output based on the difference between the instantaneous values of the output signals from the first microphone and the second microphone in order to produce a composite output with the properties of a directional microphone;
   means, coupled to the utilizing means, for adjusting a gain of the output based on the difference between the instantaneous values of the output signals from the first microphone and the second microphone by use of the estimate of the proximity of the desired acoustic source.

* * * * *